(12) United States Patent
Ham

(10) Patent No.: US 6,567,519 B1
(45) Date of Patent: May 20, 2003

(54) SYSTEM AND METHOD FOR PROCESSING AN INPUT SIGNAL COMMUNICATED ON A TELEPHONE LINE

(75) Inventor: Ronald E. Ham, Austin, TX (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 09/322,266

(22) Filed: May 28, 1999

(51) Int. Cl.⁷ .................................................. H04J 1/08
(52) U.S. Cl. ..................... 379/372; 379/93.01; 379/130; 370/488; 370/497
(58) Field of Search ................................. 370/493, 494, 370/496, 488, 480, 497; 381/10; 379/93.01, 130, 372; 333/132

(56) References Cited

U.S. PATENT DOCUMENTS

| | | | |
|---|---|---|---|
| 5,345,437 A | 9/1994 | Ogawa ........................ 370/13 |
| 5,367,540 A | 11/1994 | Kakuishi et al. ............. 375/103 |
| 5,781,617 A | 7/1998 | McHale et al. ........... 379/93.14 |
| 5,880,649 A | * 3/1999 | Tai et al. ..................... 333/132 |
| 5,982,785 A | * 11/1999 | Woerner et al. ............ 370/488 |

FOREIGN PATENT DOCUMENTS

FR  2430698 A  * 3/1980  ............ H03H/7/00

* cited by examiner

Primary Examiner—Forester W. Isen
Assistant Examiner—Daniel Swerdlow
(74) Attorney, Agent, or Firm—Baker Botts L.L.P.

(57) ABSTRACT

A system for processing an input signal communicated on a telephone line includes an input node to receive the input signal. The input signal comprises a first component associated with a first frequency band, a second component associated with a second frequency band higher than the first frequency band, and a third component associated with a third frequency band higher than the second frequency band. A first filter coupled to the input node receives the input signal, attenuates the first and third components, and communicates a first signal substantially comprising the second component. A second filter coupled to the input node receives the input signal, attenuates the second component, and communicates a second signal substantially comprising the first and third components. A third filter coupled to the second filter receives the second signal, attenuates the third component, and communicates a third signal substantially comprising the first component. An intermediate node coupled between the second and third filter may also couple to a fourth filter having an input capacitance that limits the ability of the third filter to pass the second component. In a more particular embodiment, the system is a POTS splitter, the first component is an analog telephone signal, the second component is a tax/billing tone, and the third signal is a digital data signal.

20 Claims, 4 Drawing Sheets

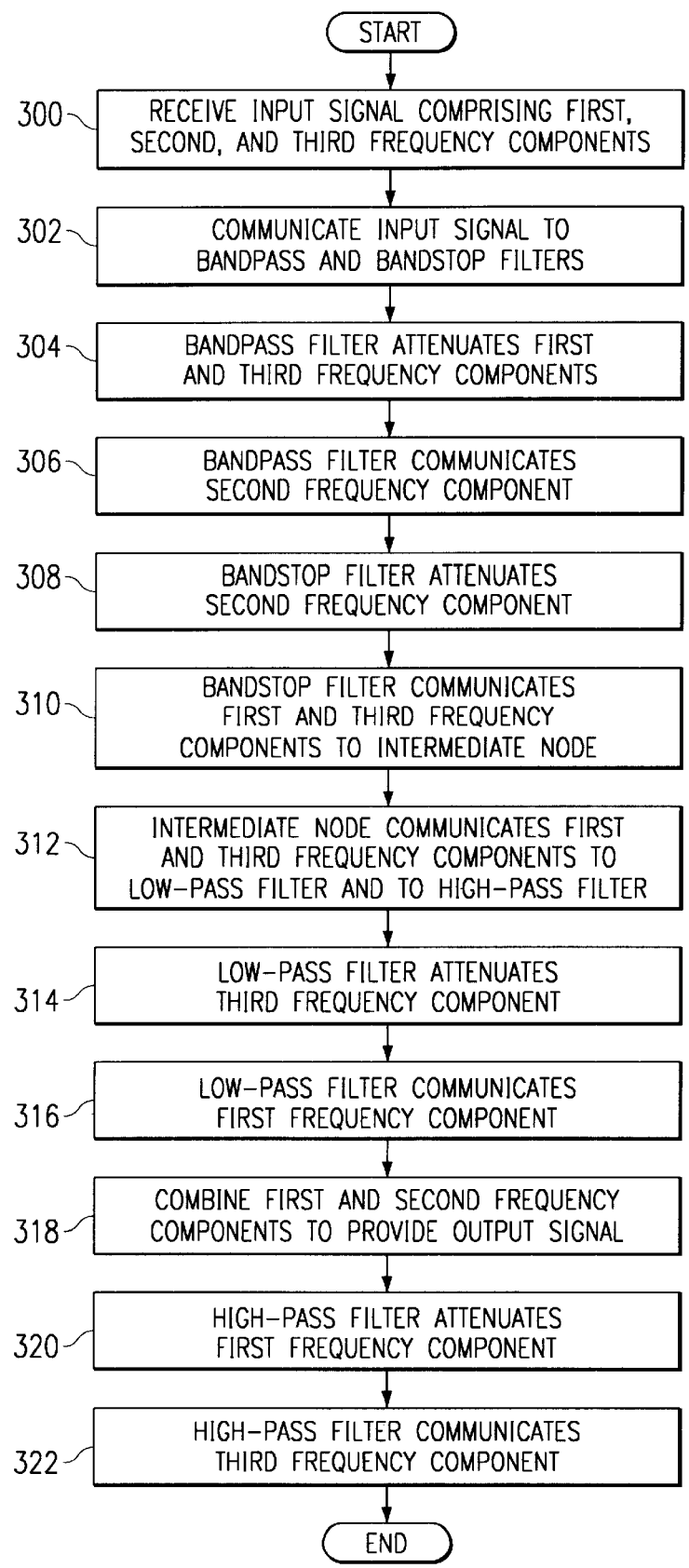

SYSTEM AND METHOD FOR PROCESSING AN INPUT SIGNAL COMMUNICATED ON A TELEPHONE LINE

RELATED APPLICATION

This application is related to U.S. application Ser. No. 09/322,330, for "Apparatus, System, and Method for Enabling Multi-Frequency Communication Over a Telephone Network Having a Billing/Tax Tone" filed May 28, 1999 by Ronald E. Ham.

TECHNICAL FIELD OF THE INVENTION

This invention relates generally to the field of telecommunications and, more particularly, to a system and method for processing an input signal communicated on a telephone line.

BACKGROUND OF THE INVENTION

Digital subscriber line (DSL) technologies allow existing twisted-pair telephone lines to communicate both analog telephone signals and digital data signals between, for example, network equipment at a central office and subscribers at remote locations. Typically, the telephone signal is communicated using a frequency band between approximately 300 Hz and approximately 3.5 kHz, and the data signal is communicated using a frequency band above approximately 25 kHz. At both the central office and a subscriber's remote location, a plain old telephone service (POTS) splitter may receive an input signal from a telephone line and separate telephone and data signals from the input signal using low-pass and high-pass filters, respectively. In addition, the POTS splitter may attenuates the spectral power from a DSL modem output to a telephone device input.

In general, a POTS splitter should satisfy two fundamental requirements to operate optimally in conjunction with a typical telephone device and a typical DSL modem. First, to avoid interfering with or degrading the quality of basic telephone services, the POTS splitter should have a characteristic impedance that suitably matches or approximates the impedance of the telephone line and the telephone device, which is typically approximately 900Ω. Second, because the high-pass filter used to separate the data signals from the input signal typically has an approximately 50–60 nF capacitance to accommodate the relatively low input impedance of the DSL modem, the POTS splitter should suitably absorb this 50–60 nF capacitance.

As individuals, organizations, businesses, and governments continue to transition from a post-industrial economy to an information-based economy, their communication needs continue to grow. Consequently, telecommunications service providers must strive to communicate an increasing amount of information over existing twisted-pair telephone lines. For example, in many European markets, service providers use additional tones or other suitable signals, usually at an intermediate frequency of either approximately 12 kHz or approximately 16 kHz, to communicate tax, billing, or other information associated with telephone calls. Service providers in other markets may have similar needs. Unfortunately, telecommunications equipment manufacturers have been unable to provide a cost-effective POTS splitter to efficiently separate these additional signals of intermediate frequencies from input signals that are transmitted over telephone lines and contains low and high frequency components associated with telephone and data signals, respectively. More particularly, previous POTS splitters cannot adequately satisfy the two fundamental requirements described above while passing intermediate frequencies above approximately 6–8 kHz, such as those typically associated with tax, billing, or other information related to calls. As a result, previous POTS splitters are increasingly inadequate for many applications.

SUMMARY OF THE INVENTION

According to the present invention, the disadvantages and problems associated with the processing of an input signal communicated on a telephone line have been substantially reduced or eliminated.

According to one embodiment of the present invention, a system for processing an input signal communicated on a telephone line includes an input node to receive the input signal. The input signal comprises a first component associated with a first frequency band, a second component associated with a second frequency band higher than the first frequency band, and a third component associated with a third frequency band higher than the second frequency band. A first filter coupled to the input node receives the input signal, attenuates the first and third components, and communicates a first signal substantially comprising the second component. A second filter coupled to the input node receives the input signal, attenuates the second component, and communicates a second signal substantially comprising the first and third components. A third filter coupled to the second filter receives the second signal, attenuates the third component, and communicates a third signal substantially comprising the first component. An intermediate node coupled between the second and the third filter may also couple to a fourth filter having an input capacitance that limits the ability of the third filter to pass the second component. In a more particular embodiment, the system is a POTS splitter, the first component is an analog telephone signal, the second component is tax/billing tones, and the third component is a digital data signal.

The system and method of the present invention provide a number of important technical advantages. In one embodiment, the present invention may provide a POTS splitter with a characteristic impedance up to approximately 900Ω that can suitably absorb a capacitance of approximately 50–60 nF while passing intermediate frequencies above approximately 6–8 kHz. As a result, the POTS splitter of the present invention is able to receive from a telephone line an input signal that contains an analog telephone signal in a first frequency band, tax/billing tone is a second frequency band higher than the first frequency band, and a digital data signal in a third frequency band higher than the second frequency band; process the input signal; communicate an output signal including the telephone signal and the tax/billing tones; and communicate another output signal including the data signal. Other technical advantages are readily apparent to those skilled in the art.

BRIEF DESCRIPTION OF THE DRAWINGS

To provide a more complete understanding of the present invention, and further features and advantages thereof, reference is now made to the following description taken in conjunction with the accompanying drawings, in which:

FIG. 5 is a flowchart illustrating an exemplary method of processing an input signal communicated on a telephone line according to the present invention.

DETAILED DESCRIPTION OF THE INVENTION

Figure 1:
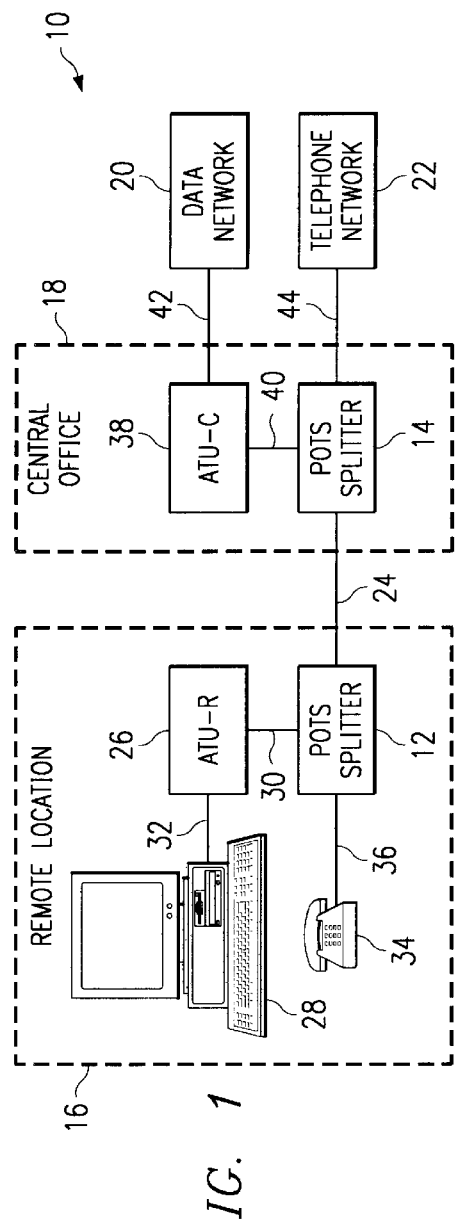
FIG. 1 illustrates an exemplary digital subscriber line system incorporating the present invention.

FIG. 1 illustrates a digital subscriber line (DSL) system 10 incorporating improved POTS splitters 12 and 14 according to the present invention. System 10 includes a remote location 16, a central office 18, a digital data network 20, and an analog telephone network 22. In general, POTS splitters 12 and 14 use asymmetric DSL (ADSL) technology to communicate telephone signals, tax/billing tones, and data signals between one another using a twisted-pair or other suitable telephone line 24. Although ADSL technology is discussed, system 10 may support integrated DSL (IDSL), symmetric DSL (SDSL), high-data-rate DSL (HDSL), rate-adaptive DSL (RADSL), very-high-data-rate DSL (VDSL) or any other suitable DSL technology. In one embodiment, POTS splitters 12 and 14 each have a characteristic impedance up to approximately 900 Ω and can suitably absorb a capacitance of approximately 50–60 nF while passing intermediate frequencies above approximately 6–8 kHz. This provides an important technical advantage for reasons described more fully below.

At remote location 16, POTS splitter 12 receives an input signal communicated from POTS splitter 14 using telephone line 24. The input signal generally comprises, without limitation, a telephone signal in a lower frequency band, tax/billing tones or other suitable signals in an intermediate frequency band that is higher than the lower frequency band, and a data signal in a higher frequency band that is higher than the intermediate frequency band. In a particular embodiment, the lower frequency band includes a band of frequencies below approximately 4 kHz, the intermediate frequency band includes at least approximately 12 kHz, approximately 16 kHz, or both approximately 12 kHz and approximately 16 kHz depending on country-specific or other suitable requirements associated with system 10, and the higher frequency band includes a band of frequencies above approximately 25 kHz. In general, POTS splitter 12 processes the input signal, separates the data signal from the telephone signal and tax/billing tones according to the present invention, and communicates an output signal including the data signal and an output signal including the telephone signal, the tax/billing tones, or both the telephone signal and tax/billing tones.

In one embodiment, POTS splitter 12 communicates the separated data signal to an ADSL transmission unit-remote (ATU-R) 26 using link 30. ATU-R 26 receives the data signal and communicates corresponding data to computer 28 using link 32. Computer 28 may be a personal computer, a workstation, a personal digital assistant, or any other suitable processing or communications device. In a particular embodiment, ATU-R 26 includes at least an ADSL modem. Although ATU-R 26 is shown as external from computer 28, ATU-R 26 may be integral to or separate from computer 28 according to particular needs. POTS splitter 12 communicates the separated telephone signal, the tax/billing tones, or both the telephone signal and tax/billing tones to telephone device 34 using link 36. Telephone device 34 may be a voice telephone, a data processing device such as a facsimile machine, or any other suitable device, singly or in any suitable combination. Links 30, 32, and 36 may be any suitable wireless, wireline, or other communication links and may each be associated with one or more intermediate components.

At central office 18, POTS splitter 14 receives an input signal communicated from POTS splitter 12 using telephone line 24. As described above, the input signal generally comprises, without limitation, a telephone signal in a lower frequency band, tax/billing tones or other suitable signals in a intermediate frequency band that is higher than the lower frequency, and a data signal in a higher frequency band that is higher than the intermediate frequency band. In a particular embodiment, the lower frequency band includes a band of frequencies below approximately 4 kHz, the intermediate frequency band includes at least approximately 12 kHz, approximately 16 kHz, or both approximately 12 kHz and approximately 16 kHz depending on country-specific or other suitable requirement associated with system 10, and the higher frequency band includes a band of frequencies above approximately 25 kHz. POTS splitter 14 processes the input signal and separates the data signal from the telephone signal and tax/billing tones.

In one embodiment, POTS splitter 14 communicates the separated data signal to ADSL transmission unit-central (ATU-C) 38 using link 40. ATU-C 38 receives the data signal from POTS splitter 14 and communicates corresponding data to data network 20 using link 42. In a particular embodiment, ATU-C 38 includes at least an ADSL modem that communicates with ATU-R 26 at remote location 16. Data network 20 may include any suitable group of one more linked computers, such as a local-area network (LAN), a wide-area network (WAN), the Internet, or any other suitable data network environment. POTS splitter 14 communicates the telephone signal, the tax/billing tones, or both the telephone signal and tax/billing tones to telephone network 22 using link 44. Telephone network 22 may include any suitable group of one or more linked telephone switches, such as a public switched telephone network (PSTN), a private switched telephone network, or any other suitable telephone network environment. Links 40, 42, and 44 may be any suitable wireless, wireline, or other communication links and may each be associated with one or more intermediate components.

Figure 2:
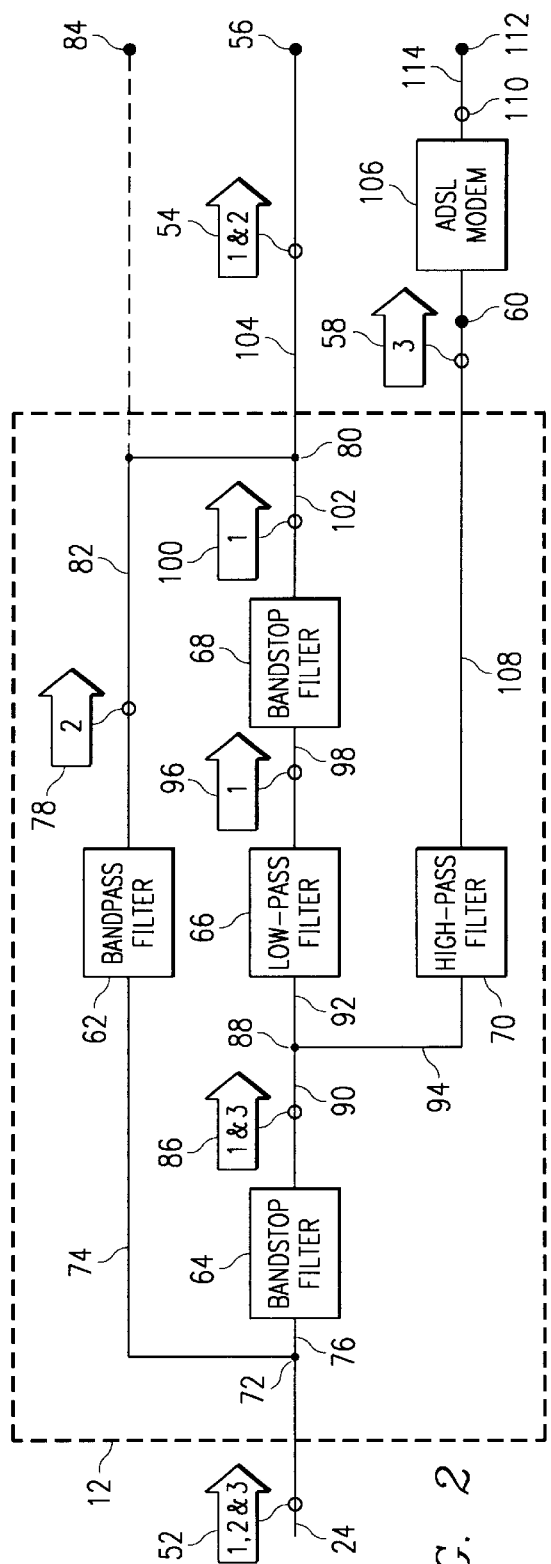
FIG. 2 is a block diagram of an exemplary POTS splitter according to the present invention.

FIG. 2 illustrates POTS splitter 12 in further detail. Although POTS splitter 12 is described, the description applies similarly to POTS splitter 14. POTS splitter 12 receives input signal 52 communicated from POTS splitter 14 using telephone line 24. As described above, input signal 52 includes at least three frequency components, without limitation: (1) a first component associated with a lower frequency band, (2) a second component associated with a intermediate frequency band that is higher than the lower frequency band, and (3) a third component associated with a higher frequency band that is higher than the intermediate frequency band. In a particular embodiment, the first component is a telephone signal in a band of frequencies below approximately 4 kHz, the second component is one or more tax/billing tones at a frequency of at least approximately 12 kHz, approximately 16 kHz, or both approximately 12 kHz and approximately 16 kHz depending on country-specific or other suitable requirements, and the third component is a data signal in a band of frequencies above approximately 25 kHz. After processing input signal 52 according to the present invention, POTS splitter 12 communicates an output signal 58 substantially including the third component, which in the particular embodiment corresponds to the data signal. POTS splitter 12 also communicates another output signal 54 substantially including the first and second components, which in the particular embodiment correspond to the telephone signal and tax/billing tones, respectively.

To produce output signal 54, POTS splitter 12 processes input signal 52 using a bandpass filter 62, a bandstop filter 64, a low-pass filter 66, and a bandstop filter 68 in any suitable combination. A explained above, in one embodiment, POTS splitter 12 satisfies at least the two fundamental requirements necessary to operate optimally in conjunction with telephone device 34 and ATU-R 26. First, to avoid interfering with or degrading the quality of basic telephone services, POTS splitter 12 has a characteristic impedance that suitably matches or approximates the impedance of telephone line 24 and telephone device 34, which is typically approximately 900Ω. Second, POTS splitter 12 may absorb the approximately 50–60 nF capacitance created by a high-pass filter 70 to accommodate the relatively low input impedance of an ADSL modem 106. Unlike previous POTS splitters, POTS splitter 12 can pass the second frequency component, which may include frequencies above approximately 6–8 kHz, in addition to passing the first lower frequency component. In one embodiment, because low-pass filter 66 suitably absorbs the capacitance of high-pass filter 70, low-pass filter 66 has a cut-off frequency of approximately 6–8 kHz. POTS splitter 12 uses bandstop filters 64 and 68 to suitably isolate the capacitance of high-pass filter 70 from the second frequency component, passing the second frequency component to output node 56 using bandpass filter 62. Thus, POTS splitter 12 may couple to ADSL modem 106 without interfering with or degrading the quality of basic telephone services, while still passing the second frequency component that includes frequencies above approximately 6–8 kHz to output node 56.

Input node 72 receives input signal 52 and passes or otherwise communicates input signal 52 to bandpass filter 62 using link 74 and to bandstop filter 64 using link 76. Bandpass filter 62 receives input signal 52, attenuates the first and third frequency components, and communicates a signal 78 substantially comprising the second frequency component to node 80 using link 82. In the particular embodiment described above, bandpass filter 62 attenuates the telephone and data signals and communicates signal 78 substantially including the tax/billing tones. In one embodiment, bandpass filter 62 may a be discrete or a high Q series resonant circuit realized with quartz or ceramic piezoelectric elements. Rather than communicate signal 78 to output node 56, bandpass filter 62 may communicate signal 78 to a separate output node 84, eliminating the need to separate the second frequency component at a later time.

As briefly described above, bandstop filter 64, alone or in combination with bandstop filter 68, suitably isolates the capacitance of high-pass filter 70 from the second frequency component of input signal 52. Because bandstop filter 64 exhibits a relatively high input impedance in the intermediate frequency band and a relatively low input impedance in the lower and higher frequency bands, bandstop filter 64 attenuates the second frequency component of input signal 52 and communicates a signal 86 substantially comprising the first and third frequency components. In the particular embodiment described above, bandstop filter 64 attenuates the tax/billing tones and communicates signal 86 substantially including the telephone and data signals. Bandstop filter 64 communicates signal 86 to intermediate node 88 using link 90. Intermediate node 88 receives signal 86 from bandstop filter 64 and passes or otherwise communicates signal 86 to low-pass filter 66 using link 92 and to high-pass filter 70 using link 94.

Low-pass filter 66 receives signal 86, attenuates the third frequency component, and communicates a signal 96 substantially comprising the first frequency component to a bandstop filter 68 using link 98. In the particular embodiment described above, low-pass filter 66 attenuates the data signal and communicates signal 96 that substantially includes the telephone signal.

As briefly described above, bandstop filter 68, alone or in combination with bandstop filter 64, suitably isolates the capacitance of high-pass filter 70 from the second frequency component of input signal 52. Signal 78 communicated from bandpass filter 62 substantially includes the second frequency component. Because bandstop filter 68 exhibits a relatively high input impedance in the intermediate frequency band, bandstop filter 68 suitably isolates the capacitance of high-pass filter 70 from signal 78. Signal 96 communicated from low-pass filter 66 substantially includes the first frequency component, which in the particular embodiment described above corresponds to the telephone signal. Because bandstop filter 68 exhibits a relatively low input impedance in the lower frequency band, bandstop filter 68 receives signal 96 and communicates a signal 100 that also substantially includes the first frequency component. Bandstop filter 68 communicates output signal 100 to node 80 using link 102.

Node 80 combines signal 78 from bandpass filter 62 and signal 100 from bandstop filter 68 to provide a combined output signal 54 to telephone device 34 through output node 56. As described above, output signal 54 substantially includes the first and second frequency components, which in the particular embodiment described above correspond to the telephone signal and tax/billing tones, respectively. Unlike previous POTS splitters, POTS splitter 12 is able to pass the second frequency component including frequencies above approximately 6–8 kHz, along with the first frequency component, providing an important technical advantage. Using bandstop filters 64 and 68 to suitably isolate the input capacitance of high-pass filter 70 from the second frequency component, POTS splitter 12 passes the second frequency component to output node 56 using bandpass filter 62.

High-pass filter 70 receives signal 86 from bandstop filter 64, attenuates the first frequency component, and communicates an output signal 58 substantially including the third frequency component to ADSL modem 106 using link 108. In the particular embodiment described above, high-pass filter 70 attenuates the telephone signal and communicates output signal 58 substantially including the data signal. In one embodiment, high-pass filter 70 has an approximately 50–60 nF capacitance to accommodate the relatively low input impedance of ADSL modem 106. Although high-pass filter 70 is shown as separate from ADSL modem 106, high-pass filter 70 may be integral to or separate from POTS splitter 12, ADSL modem 106, or both POTS splitter 12 and ADSL modem 106 according to particular needs.

ADSL modem 106 receives output signal 58 and communicates corresponding data 110 to output node 112 using link 114. ADSL modem 106 may implement any of a variety of DSL technologies, including ADSL, IDSL, SDSL, HDSL, RADSL, and VDSL, without limitation. In a particular embodiment, ADSL modem 106 is integral to ATU-R 26 and communicates data 110 to computer 28. Similarly, where POTS splitter14 is used rather than POTS splitter 12, ADSL modem 106 may be integral to ATU-C 38 and may communicate data 110 to data network 20. Links 74, 76, 82, 90, 92, 94, 98, 102, 104, 108, and 114 may be any suitable wireless, wireline, or other communication links and each may be associated with one or more intermediate components.

Figure 3:
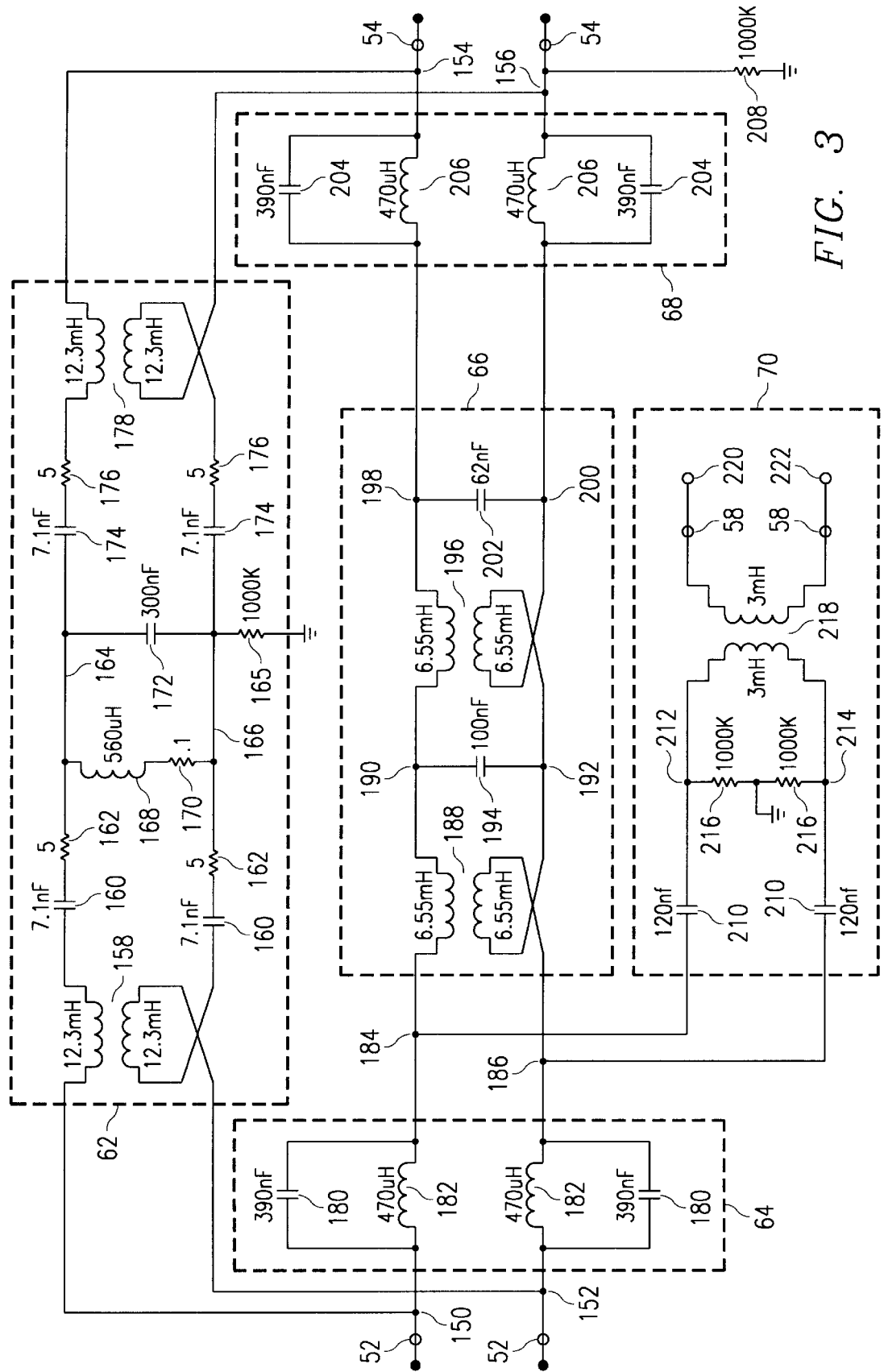
FIG. 3 is a circuit diagram of an exemplary POTS splitter according to the present invention.

FIG. 3 is a circuit diagram of an exemplary POTS splitter 12 or 14 according to the present invention. Those skilled in the art will appreciate that other suitable circuit arrangements may be used without departing from the intended scope of the present invention. In particular, Bandpass filter 62, bandstop filter 64, low-pass filter 66, bandstop filter 68, and high-pass filter 70 may include suitable additional, alternative, or omitted elements, and the elements may have any suitable values, the specific values shown in FIG. 3 being merely exemplary. Furthermore, although bandpass filter 62, bandstop filter 64, low-pass filter 66, bandstop filter 68, and high-pass filter 70 are coupled by single lines in FIG. 2, links 74, 76, 82, 90, 92, 94, 98, 102, and 104 may each include a pair of communication paths corresponding to the two wires of a twisted-pair telephone line, as shown in FIG. 3.

Bandpass filter 62 includes a configuration of transformers, an inductor, capacitors, and resistors coupling input nodes 150 and 152 to nodes 154 and 156. A transformer 158 is coupled to input nodes 150 and 152. A first capacitor 160 and a first resistor 162 are coupled in series between transformer 158 and a node 164, and a second capacitor 160 and a second resistor 162 are also coupled in series between transformer 158 and a node 166. An inductor 168 and a resistor 170 are coupled in series between nodes 164 and 166, and a capacitor 172 is coupled between nodes 164 and 66 in parallel with inductor 168 and resistor 170. A resister 165 is coupled between node 166 and ground. A first capacitor 174 and a first resistor 176 are coupled in series between node 164 and a transformer 178, and a second capacitor 174 and a second resistor 176 are also coupled in series between node 166 and transformer 178. Transformer 178 is coupled to nodes 154 and 156. In an alternative embodiment, separate inductors may replace one or both transformers 158 and 178, as would be apparent to one skilled in the art.

Bandstop filter 64 includes a configuration of capacitors and inductors. A capacitor 180 and an inductor 182 are coupled in parallel between input node 150 and an intermediate node 184. A second capacitor 180 and a second inductor 182 are coupled in parallel between input node 152 and an intermediate node 186.

Low-pass filter 66 includes another configuration of transformers and capacitors. A transformer 188 is coupled between intermediate node 184 and a node 190 and between intermediate node 186 and a node 192. A capacitor 194 is coupled between nodes 190 and 192. A transformer 196 couples nodes 190 and 198 to nodes 192 and 200. A capacitor 202 is coupled between nodes 198 and 200. In an alternative embodiment, separate inductors may replace one or both transformers 188 and 196.

Bandstop filter 68 includes another configuration of capacitors and inductors. A first capacitor 204 and a first inductor 206 are coupled in parallel between nodes 198 and 154. A second capacitor 204 and a second inductor 206 are coupled in parallel between nodes 200 and 156. A resistor 208 is coupled between node 156 and ground.

High-pass filter 70 is coupled to intermediate nodes 184 and 186. A first capacitor 210 is coupled between intermediate node 184 and a node 212, and a second capacitor 210 is coupled between intermediate node 186 and a node 214. A first shunt capacitor 216 is coupled between node 212 and ground, and a second shunt capacitor 216 is coupled between node 214 and ground. A transformer 218 couples nodes 212 and 214 to nodes 220 and 222.

Figure 4:
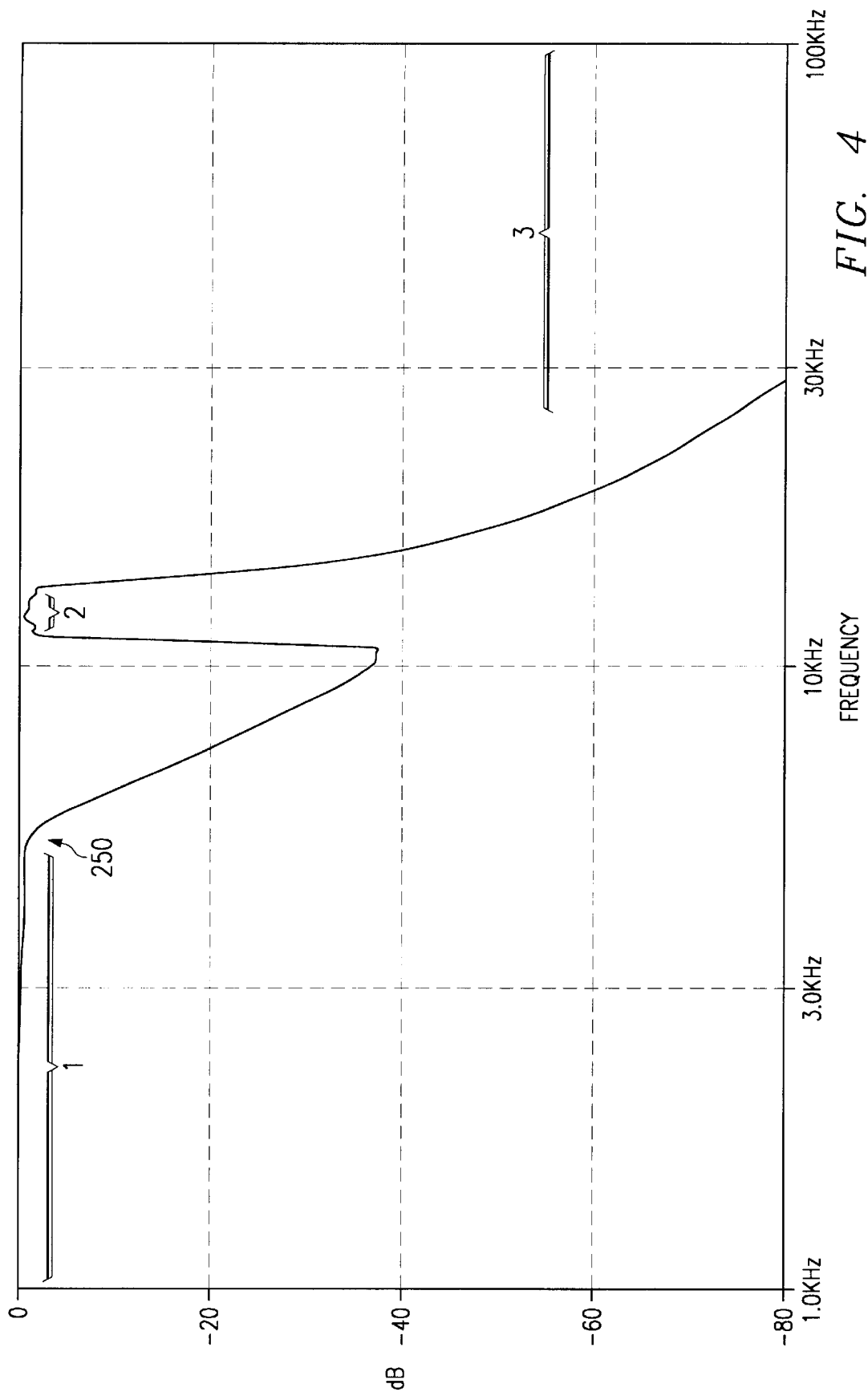
FIG. 4 is a graph illustrating exemplary transmission characteristics of a POTS splitter according to the present invention.

FIG. 4 is a graph illustrating exemplary transmission characteristics of a particular POTS splitter 12 or 14, as reflected in output signal 54. As illustrated, output signal 54 substantially includes a first frequency component 1 and a second frequency component 2, which in the particular embodiment described above correspond to the telephone signal and the tax/billing tones, respectively. First frequency component 1 represents the output of low-pass filter 66. Because low-pass filter 66 suitably absorbs the capacitance of high-pass filter 70, in one embodiment low-pass filter 66 has a cut-off frequency of approximately 6–8 kHz, which is illustrated as a first break frequency 250 at approximately 6–8 kHz. As a result, low-pass filter 66 is able to pass an analog telephone signal, which typically contains frequencies less than approximately 4 kHz, but not tax/billing tones at frequencies above approximately 6–8 kHz. As described above, POTS splitters 12 and 14, unlike previous POTS splitters, use bandstop filters 64 and 68 to pass second frequency component 2 around low-pass filter 66 and through bandpass filter 62 to output node 56. Second frequency component 2 represents the output of bandpass filter 62. In the particular embodiment associated with FIG. 4, second frequency component 2 is at approximately 12 kHz and POTS splitter 12 or 14 may passes tax/billing tones received in the intermediate frequency band of input signal 52. In alternative embodiments, second frequency component 2 may be at approximately 16 kHz or any other suitable intermediate frequency above approximately 6–8 kHz. As described more fully above, output signal 54 does not include third frequency component 3 in a frequency band above approximately 25 kHz.

FIG. 5 is a flowchart illustrating an exemplary method of processing an input signal 52. The method begins at step 300, where input node 72 receives input signal 52 including first frequency component 1, second frequency component 2, and third frequency component 3 corresponding to the telephone signal, the tax/billing tones, and the data signal, respectively. Input node 72 passes or otherwise communicates input signal 52 to bandpass filter 62 and to bandstop filter 64 at step 302. Bandpass filter 62 attenuates first frequency component 1 and third frequency component 3, corresponding to the telephone signal and data signal, respectively, at step 304 and communicates at least second frequency component 2, corresponding to the tax/billing tones, at step 306. Bandstop filter 64 attenuates second frequency component 2, corresponding to the tax/billing tones, at step 308 and communicates first frequency component 1 and third frequency component 3, corresponding to the telephone signal and data signal, respectively, to intermediate node 88 at step 310. At step 312, intermediate node 88 passes or otherwise communicates first frequency component 1 and third frequency component 3 to low-pass filter 66 and to high-pass filter 70. Low-pass filter 66 attenuates third frequency component 3, corresponding to the data signal, at step 314 and communicates first frequency component 1, corresponding to the telephone signal, at step 316. At step 318, node 80 receives first frequency component 1 from low-pass filter 66 and second frequency component 2 from band-pass filter 62, combines first frequency component 1 and second frequency component 2, and communicates output signal 54 substantially including first frequency component 1 and second frequency component 2, corresponding to the telephone signal and the tax/billing tones, respectively. High-pass filter 70 attenuates first frequency component 1, corresponding to the telephone signal, at step 320, communicates third frequency component 3, corresponding to the data signal, at step 322, and the method ends.

Although the present invention has been described with several embodiments, a person skilled in the art could make various alterations, modifications, and additions without departing from the spirit and scope of the present invention as defined in the appended claims.

What is claimed is:

1. A system for processing an input signal communicated on a telephone line, comprising:
   an input node operable to receive the input signal, the input signal comprising a first component associated with a first frequency band, a second component associated with a second frequency band higher than the first frequency band, and a third component associated with a third frequency band higher than the second frequency band;
   a first filter coupled to the input node and operable to receive the input signal, to attenuate the first and third components, and to communicate a first signal substantially comprising the second component;
   a second filter coupled to the input node and operable to receive the input signal, to attenuate the second component, and to communicate a second signal substantially comprising the first and third components;
   a third filter coupled to the second filter and operable to receive the second signal, to attenuate the third component, and to communicate a third signal substantially comprising the first component; and
   an intermediate node coupled between the second and third filters and operable to couple to a fourth filter having an input capacitance that limits the ability of the third filter to pass the second component.

2. The system of claim 1, wherein:
   the first component comprises an analog telephone signal;
   the second component comprises a tax/billing tone; and
   the third component comprises a digital data signal.

3. The system of claim 1, wherein:
   the first frequency band comprises a band of frequencies below approximately 4 kHz;
   the second frequency band comprises a frequency selected from the group consisting of approximately 12 kHz and approximately 16 kHz; and
   the third frequency band comprises a band of frequencies above approximately 25 kHz.

4. The system of claim 1, wherein the fourth filter is operable to receive the second signal from the intermediate node, to attenuate the first component, and to communicate an output signal substantially comprising the third component.

5. The system of claim 4, wherein:
   the third filter is operable to couple to a telephone device and to communicate the third signal to the telephone device; and
   the fourth filter is operable to couple to a digital subscriber line modem and to communicate the output signal to the modem.

6. The system of claim 4, wherein:
   the third filter is operable to couple to a telephone network and to communicate the third signal to the telephone network; and
   the fourth filter is operable to couple to a data network and to communicate the output signal to the data network.

7. The system of claim 1, further comprising an output node coupled to the first and third filters, the output node operable to receive the first and third signals and to communicate an output signal substantially comprising the first and second components.

8. The system of claim 1, wherein the input capacitance of the fourth filter comprises approximately 60 nF.

9. A POTS splitter for processing an input signal communicated on a telephone line, comprising:
   an input node operable to receive the input signal, the input signal comprising a an analog telephone signal below approximately 4 kHz, tax/billing tones at a frequency selected from the group consisting of approximately 12 kHz and approximately 16 kHz, and a digital data signal above approximately 25 kHz;
   a first filter coupled to the input node and operable to receive the input signal, to attenuate the telephone and data signals, and to communicate a first signal substantially comprising the tax/billing tones;
   a second filter coupled to the input node and operable to receive the input signal, to attenuate the tax/billing tones, and to communicate a second signal substantially comprising the telephone and data signals;
   a third filter coupled to the second filter and operable to receive the second signal, to attenuate the data signal, and to communicate a third signal substantially comprising the telephone signal; and
   an intermediate node coupled between the second and third filters and operable to couple to a fourth filter having an input capacitance that limits the ability of the third filter to pass the tax/billing tones.

10. The POTS splitter of claim 9, wherein:
    the fourth filter is operable to receive the second signal from the intermediate node, to attenuate the telephone signal, and to communicate an output signal substantially comprising the data signal;
    the third filter is operable to couple to a telephone device and to communicate the third signal to the telephone device; and
    the fourth filter is operable to couple to a digital subscriber line modem and to communicate the output signal to the modem.

11. The POTS splitter of claim 9, further comprising an output node coupled to the first and third filters, the output node operable to receive the first and third signals and to communicate an output signal substantially comprising the telephone signal and tax/billing tones.

12. The POTS splitter of claim 1, wherein the input capacitance of the fourth filter comprises approximately 60 nF.

13. A method for processing an input signal communicated on a telephone line, comprising:
    receiving the input signal at a first filter and at a second filter, the input signal comprising a first component associated with a first frequency band, a second component associated with a second frequency band higher than the first frequency band, and a third component associated with a third frequency band higher than the second frequency band;
    attenuating the first and third components using the first filter;
    communicating from the first filter a first signal substantially comprising the second component;
    attenuating the second component using the second filter;
    communicating from the second filter a second signal substantially comprising the first and third components;
    receiving the second signal at a third filter;
    attenuating the third component using the third filter; and
    communicating from the third filter a third signal substantially comprising the first component, wherein the third filter is operable to couple to a fourth filter having an input capacitance that limits the ability of the third filter to pass the second component.

14. The method of claim 13, wherein:

the first component comprises an analog telephone signal;

the second component comprises a tax/billing tone; and the third component comprises a digital data signal.

15. The method of claim 13, wherein:

the first frequency band comprises a band of frequencies below approximately 4 kHz;

the second frequency band comprises a frequency selected from the group consisting of approximately 12 kHz and approximately 16 kHz; and the third frequency band comprises a band of frequencies above approximately 25 kHz.

16. The method of claim 13, further comprising:

receiving the second signal at the fourth filter;

attenuating the first component using the first filter; and communicating from the fourth filter an output signal substantially comprising the third component.

17. The method of claim 16, further comprising:

communicating the third signal from the third filter to a telephone device; and communicating the output signal from the fourth filter to a digital subscriber line modem.

18. The method of claim 16, further comprising:

communicating the third signal from the third filter to a telephone network; and communicating the output signal from the fourth filter to a data network.

19. The method of claim 13, further comprising:

receiving the first signal and the third signal at an output node; and communicating from the output node an output signal substantially comprising the first and second components.

20. The method of claim 13, wherein the input capacitance of the fourth filter is approximately 60 nF.

* * * * *

UNITED STATES PATENT AND TRADEMARK OFFICE
CERTIFICATE OF CORRECTION

PATENT NO. : 6,567,519 B1
DATED : May 20, 2003
INVENTOR(S) : Ronald E. Ham

It is certified that error appears in the above-identified patent and that said Letters Patent is hereby corrected as shown below:

Column 10,
Line 44, delete "Claim 1" and insert -- Claim 9 --.

Signed and Sealed this

Ninth Day of March, 2004

JON W. DUDAS
*Acting Director of the United States Patent and Trademark Office*